(12) United States Patent
Yamamichi et al.

(10) Patent No.: US 8,004,085 B2
(45) Date of Patent: Aug. 23, 2011

(54) SEMICONDUCTOR DEVICE AND METHOD OF MANUFACTURING SEMICONDUCTOR DEVICE

(75) Inventors: Shintaro Yamamichi, Tokyo (JP); Katsumi Kikuchi, Tokyo (JP); Jun Sakai, Tokyo (JP); Hikaru Kouta, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 12/593,824

(22) PCT Filed: Feb. 13, 2008

(86) PCT No.: PCT/JP2008/052326
§ 371 (c)(1),
(2), (4) Date: Jan. 7, 2010

(87) PCT Pub. No.: WO2008/126468
PCT Pub. Date: Oct. 23, 2008

(65) Prior Publication Data
US 2010/0117228 A1 May 13, 2010

(30) Foreign Application Priority Data

Mar. 30, 2007 (JP) ................................. 2007-092727

(51) Int. Cl.
*H01L 23/48* (2006.01)
*H01L 23/52* (2006.01)
*H01L 29/40* (2006.01)
*H01L 27/10* (2006.01)
*H01L 29/73* (2006.01)
*H01L 29/74* (2006.01)

(52) U.S. Cl. ........ 257/758; 257/207; 257/208; 257/211; 257/E21.016; 257/E21.575; 257/E21.627; 257/E21.641

(58) Field of Classification Search .................. 257/207, 257/208, 211, 758, E21.016, E21.575, E21.627, 257/E21.641
See application file for complete search history.

(56) References Cited

U.S. PATENT DOCUMENTS

| | | | |
|---|---|---|---|
| 6,531,785 B2 * | 3/2003 | Shimizu et al. | 257/786 |
| 6,566,899 B2 * | 5/2003 | Tamaru et al. | 324/756.05 |
| 6,639,315 B2 | 10/2003 | Miura et al. | |
| 6,727,533 B2 | 4/2004 | Matsuzaki et al. | |
| 6,876,084 B2 * | 4/2005 | Hsu | 257/773 |

(Continued)

FOREIGN PATENT DOCUMENTS

JP 2006-032600 A 2/2002

(Continued)

*Primary Examiner* — Ida M Soward
(74) *Attorney, Agent, or Firm* — Sughrue Mion, PLLC (57) ABSTRACT

A semiconductor device has an element interconnection 2, a top-layer element interconnection 4, a super-connect interconnection 10 and a bump 7. The element interconnection 2 is provided on a semiconductor substrate 1 through a plurality of insulating layers 50. The top-layer element interconnection 4 is formed above the element interconnection 2 by using a substantially equivalent process equipment. The super-connect interconnection 10 is provided on the top-layer element interconnection 4 through a super-connect insulating layer 9 having a thickness five or more times larger than that of the insulating layer 5, and has a thickness three or more times larger than that of each the element interconnection 2 and the top-layer element interconnection 4. The bump 7 is formed on the super-connect interconnection 10. The top-layer element interconnection 4 has a signal pad 4s, a power source pad 4v and a ground pad 4g. An area of the signal pad 4s is smaller than each area of the power source pad 4v and the ground pad 4g.

10 Claims, 10 Drawing Sheets

U.S. PATENT DOCUMENTS

| | | | |
|---|---|---|---|
| 6,885,541 B2 * | 4/2005 | Otsuka et al. | 361/306.3 |
| 7,167,374 B2 * | 1/2007 | Aizawa | 361/760 |
| 7,294,870 B2 * | 11/2007 | Lin | 257/211 |
| 7,372,155 B2 * | 5/2008 | Lin | 257/758 |
| 7,378,602 B2 * | 5/2008 | Ikeda | 174/262 |
| 7,525,814 B2 * | 4/2009 | Yuri et al. | 361/761 |
| 2003/0040131 A1 | 2/2003 | Kai | |
| 2005/0017345 A1 * | 1/2005 | Sathe | 257/700 |
| 2006/0012029 A1 | 1/2006 | Kikuchi et al. | |
| 2006/0087029 A1 * | 4/2006 | Imanaka et al. | 257/723 |
| 2007/0194433 A1 * | 8/2007 | Suwa et al. | 257/700 |
| 2008/0143379 A1 * | 6/2008 | Norman | 326/39 |

FOREIGN PATENT DOCUMENTS

| | | |
|---|---|---|
| JP | 2002-093946 A | 3/2002 |
| JP | 2002-170928 A | 6/2002 |
| JP | 2002-212782 A | 7/2002 |
| JP | 2002-353614 A | 12/2002 |
| JP | 2003-060053 A | 2/2003 |
| JP | 2004-056036 A | 2/2004 |

* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device, particularly to a semiconductor device having both a fine interconnection for a semiconductor element and a super-connect interconnection, and a method of manufacturing the semiconductor device. This application is based upon and claims the benefit of priority from Japanese patent application No. 2007-092727, filed on Mar. 30, 2007, the disclosure of which is incorporated herein in its entirely by reference.

BACKGROUND ART

A semiconductor device of a related technique is described in Japanese Laid-Open Patent Application JP-2002-170928 (U.S. Pat. No. 6,727,533B2) and Japanese Laid-Open Patent Application JP-2002-093946 (U.S. Pat. No. 6,639,315B2).

Japanese Laid-Open Patent Application JP-2002-170928 discloses a semiconductor device. The semiconductor device has a fine interconnection layer in a semiconductor element, a giant interconnection (super-connect) layer and a switch circuit. In this semiconductor device, an interconnection gap in the super-connect interconnection layer is larger as compared with an interconnection gap in the interconnection layer in the semiconductor element, and thus parasitic capacitance of interconnection is small and electric resistance is low. On the other hand, Japanese Laid-Open Patent Application JP-2002-093946 discloses a semiconductor device and a package structure of the semiconductor device. In this semiconductor device, a thick and low-elasticity stress relaxation layer is provided between a pad on a semiconductor element and a land used for an external terminal, and an electrostatic capacitance between an interconnection in the semiconductor element and an extraction interconnection to the land is reduced by the thick stress relaxation layer.

However, according to the above-mentioned related technique described in Japanese Laid-Open Patent Application JP-2002-170928 and Japanese Laid-Open Patent Application JP-2002-093946, even though the parasitic capacitance between the super-connect interconnections or between top and bottom of the stress relaxation layer can be reduced, an overall structure of the semiconductor element and the super-connect interconnection is not optimized. Therefore, there is a problem in that signal quality is deteriorated, particularly in a case where a high-speed signal over 10 Gbps is to be handled.

As a related technique, Japanese Laid-Open Patent Application JP-2006-32600 (US2006012029(A1)) discloses a semiconductor device. The semiconductor device has: a semiconductor substrate; a fine interconnection structure section in which one or plural first interconnection layers and one or plural first insulating layers are alternately stacked on said semiconductor substrate; a first giant interconnection structure section in which one or plural second interconnection layers and one or plural second insulating layers are alternately stacked on said fine interconnection structure section; and a second giant interconnection structure section in which one or plural third interconnection layers and one or plural third insulating layers are alternately stacked on said first giant interconnection structure section. Said first to third giant interconnection layers respectively have insulating films and interconnections. Said second insulating layer and said third insulating layer are thicker than said first insulating layer. An elastic modulus of said third insulating layer at 25 degrees centigrade is not more than an elastic modulus of said second insulating layer at 25 degrees centigrade. A thickness of each said third interconnection layer and said second interconnection layer is equal to or more than two times a thickness of said first interconnection layer.

Figure 1:
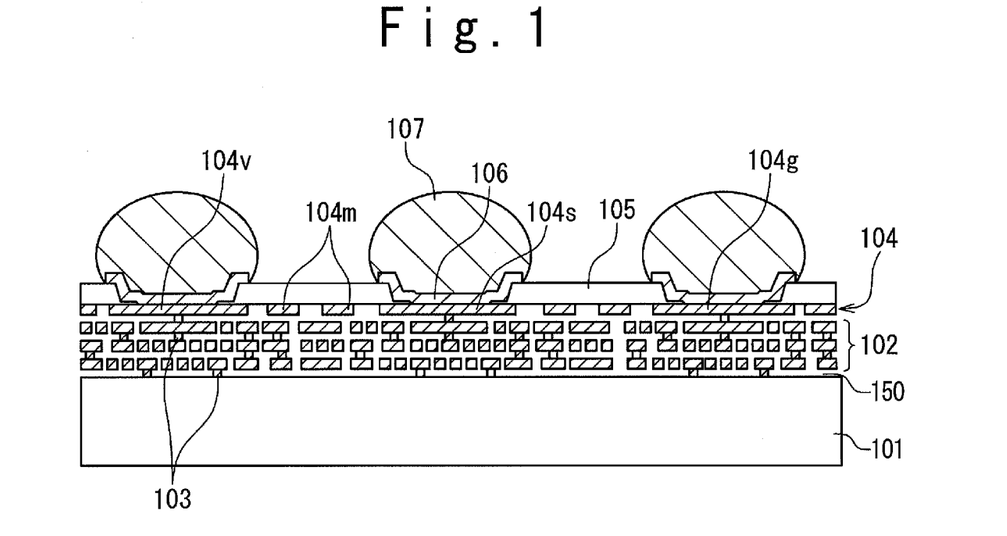
FIG. 1 is a cross-sectional view showing a configuration of a semiconductor device according to a related technique.

This time, the inventors of the present application have recognized the following points. FIG. 1 is a cross-sectional view showing a configuration of a semiconductor device of a related technique. The semiconductor device of the related technique has semiconductor element interconnections 102 that are provided in a plurality of insulating layers 150 on a semiconductor substrate 101 including transistor circuits (not shown) and are connected through semiconductor element interconnection vias 103. In the semiconductor device, there further exists a top-layer semiconductor element interconnection 104 thereon that is formed by a substantially equivalent process equipment as in the case of the semiconductor element interconnection 102. The top-layer semiconductor element interconnection 104 includes a power source pad 104v, a ground pad 104g, a signal pad 104s and other routed interconnections 104m. The power source pad 104v, the ground pad 104g and the signal pad 104s are substantially the same in size. A under bump metallization (UBM) 106 is formed on the top-layer semiconductor element interconnection 104 through a cover film 105. The power source pad 104v, the ground pad 104g and the signal pad 104s are respectively connected to bumps 107 as external connection terminals.

Here, a reason why the power source pad 104v, the ground pad 104g and the signal pad 104s are substantially the same in size is as follows. For example, let us consider a case where the bump 107 is made of alloy of Sn and Ag, wherein a metal layer is formed in a desired region by plating and then reflow is performed to form the bump 107 having a shape shown in FIG. 1. In this case, if the above-mentioned three kinds of pads are not the same in size, the respective ball-shape bumps 107 including the UBM 106 become different in size, which prevents excellent external connection. The same reason applies to a case where bump material is formed by printing or a spherical ball is transferred. Consequently, the power source pad 104v, the ground pad 104g and the signal pad 104s are substantially the same in size.

However, in a case where the semiconductor device having the structure shown in FIG. 1 according to the related technique operates at ultrahigh speed, particularly over 10 Gbps, the input-output to a signal line becomes unstable and thus signal communication between the semiconductor device and the outside thereof becomes impossible, which is a problem that was first revealed by the inventors as a result of earnest research. At the same time, the reason for this was first revealed by the inventors as a result of the research; that is, coupling capacitance between the signal pad 104s in the top-layer semiconductor element interconnection 104 and the semiconductor element interconnection 102 in the lower layer is large, which deteriorates the signal quality.

Figure 2:
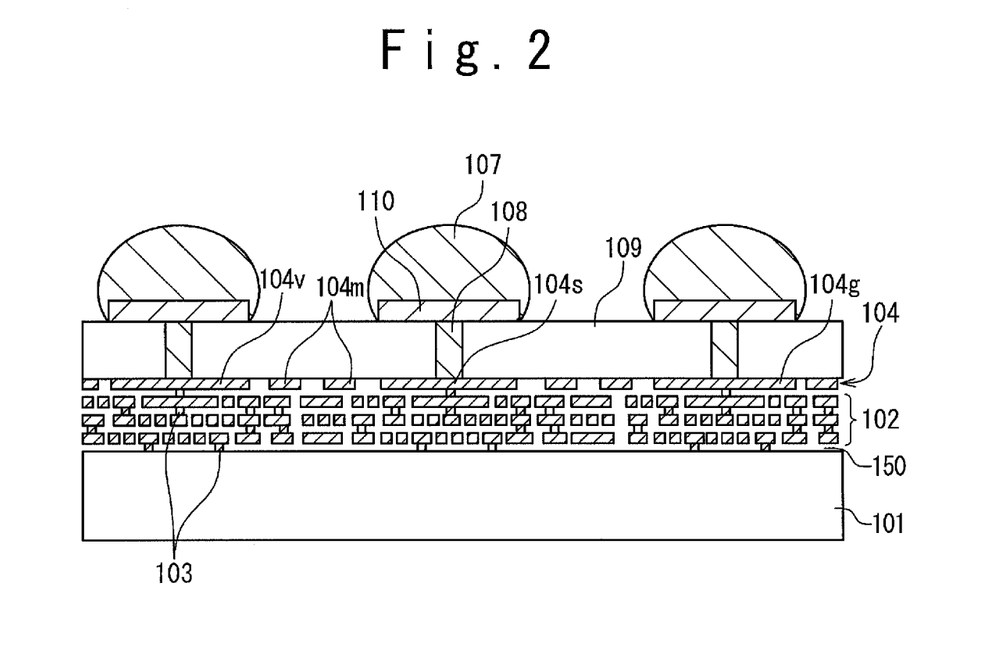
FIG. 2 is a cross-sectional view showing a configuration of a semiconductor device using a super-connect technology according to a related technique.

One possible solution to solve the problem and to reduce the parasitic capacitance is to use the super-connect technology in which thicknesses of an interconnection and an insulating film are several times (e.g. three to ten times) larger than those of a semiconductor element interconnection and a semiconductor element insulating film, respectively. FIG. 2 is a cross-sectional view showing a configuration in which the super-connect technology is applied to the semiconductor device of the related technique. In this case, a thick super-connect insulating film 109 and a thick super-connect interconnection 110 (connected to the top-layer semiconductor element interconnection 104 through a super-connect via 108) are merely formed on the top-layer semiconductor element interconnection 104. Therefore, although parasitic capacitance between the super-connect interconnection 110 and another portion through the super-connect insulating film 109 is reduced, there still remains the essential problem, namely the large parasitic capacitance between the signal pad 104s and the semiconductor element interconnection 102 in the lower layer, which does not improve the deterioration of the transmission characteristics.

DISCLOSURE OF INVENTION

An object of the present invention is to provide a semiconductor device that can input/output a high-speed signal without deteriorating quality of the signal, and a method of manufacturing the semiconductor device.

The object, other objects and advantages of the present invention can be easily confirmed with reference to the following description and attached drawings.

A semiconductor device according to the present invention has an element interconnection, a top-layer element interconnection, a super-connect interconnection and a bump. The element interconnection is provided on a semiconductor substrate having a semiconductor element through a plurality of insulating layers. The top-layer element interconnection is formed above the element interconnection by using a substantially equivalent process equipment. The super-connect interconnection is provided on the top-layer element interconnection through a super-connect insulating layer having a thickness five or more times larger than that of the insulating layer, and has an interconnection thickness three or more times larger than that of each the element interconnection and the top-layer element interconnection. The bump is formed on the super-connect interconnection. The top-layer element interconnection has a signal pad, a power source pad and a ground pad. An area of the signal pad is smaller than each area of the power source pad and the ground pad.

A method of manufacturing a semiconductor device according to the present invention includes: a process of forming a semiconductor element on a semiconductor substrate; a process of forming an element interconnection provided on the semiconductor substrate through a plurality of insulating layers; a process of forming a top-layer element interconnection having a signal pad, a power source pad and a ground pad above the element interconnection, by using a substantially equivalent process equipment; a process of forming a super-connect insulating layer on the top-layer element interconnection and a super-connect via embedded in the super-connect insulating layer, wherein the super-connect insulating layer has a thickness five or more times larger than that of the insulating layer; a process of forming a super-connect interconnection on the super-connect via, wherein the super-connect interconnection has an interconnection thickness three or more times larger than that of each the element interconnection and the top-layer element interconnection; and a process of forming a bump on the super-connect interconnection. The process of forming the top-layer element interconnection includes a process of making an area of the signal pad smaller than each area of the power source pad and the ground pad.

BEST MODE FOR CARRYING OUT THE INVENTION

Exemplary embodiments of a semiconductor device and a method of manufacturing the semiconductor device according to the present invention will be described below with reference to the attached drawings.

First Exemplary Embodiment

Figure 3:
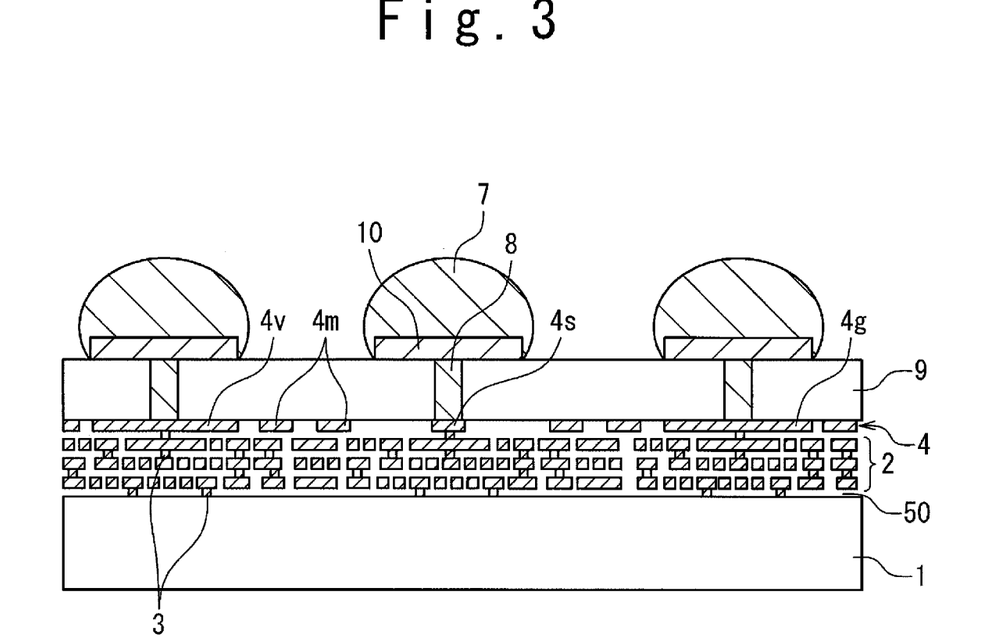
FIG. 3 is a cross-sectional view showing a configuration of a semiconductor device according to a first exemplary embodiment of the present invention.

A first exemplary embodiment of the semiconductor device and the method of manufacturing the semiconductor device according to the present invention will be described with reference to the attached drawings. FIG. 3 is a cross-sectional view showing a configuration of the semiconductor device according to the first exemplary embodiment of the present invention. The semiconductor device has a semiconductor substrate 1, a semiconductor element interconnection 2, a semiconductor element interconnection via 3, a top-layer semiconductor element interconnection 4, a super-connect insulating layer 9, a super-connect via 8, a super-connect interconnection 10 and a bump 7.

The semiconductor substrate 1 is a substrate made of semiconductor and includes transistor circuits (not shown). The semiconductor element interconnection 2 is provided in each interconnection layer within a plurality of insulating layers 50 and is connected with the semiconductor element interconnection via 3. The top-layer semiconductor element interconnection 4, which is an interconnection formed by using a substantially equivalent process equipment as in the case of the semiconductor element interconnection 2, is provided in an interconnection layer above the semiconductor element interconnection 2. The top-layer semiconductor element interconnection 4 includes a power source pad 4v, a ground pad 4g, a signal pad 4s and other routed interconnections 4m. The super-connect insulating layer 9 is so provided as to cover the top-layer semiconductor element interconnection 4. The super-connect via 8 is so provided as to be connected to the top portion of the top-layer semiconductor element interconnection 4 and penetrate through the super-connect insulating layer 9. The super-connect interconnection 10 is provided on the super-connect insulating layer 9 and is connected to the top portion of the super-connect via 8. The bump 7 is formed as an external connection terminal on the super-connect interconnection 10.

In the present invention, the super-connect insulating layer 9, the super-connect via 8 and the super-connect interconnection 10 are formed by using a process equipment that is substantially different from that for the semiconductor element interconnection 2 and the top-layer semiconductor element interconnection 4. It is preferable that a thickness of the super-connect interconnection 10 is three or more times larger than a thickness of each the semiconductor element interconnection 2 and the top-layer semiconductor element interconnection 4. It is preferable that a thickness of the super-connect insulating layer 9 is five or more times larger than a thickness of the insulating layer 50 (single layer) provided between the semiconductor element interconnections 2 or the top-layer semiconductor element interconnection 4.

Regarding the pads of the top-layer semiconductor element interconnection 4 connected to the super-connect via 8, it is preferable that an area of the signal pad 4s is smaller as compared with each area of the other power source pad 4v and ground pad 4g as shown in FIG. 3. Furthermore, it is more preferable that the area of the signal pad 4s is as small as possible to the extent permitted by a formation margin of the super-connect via 8. By making the area of the signal pad 4s relatively small and preferably as small as possible, the coupling capacitance between the signal pad 4s and the semiconductor element interconnection 2 in the lower layer is reduced. As a result, the parasitic capacitance of the signal pad 4s is reduced, which makes it possible to input/output a high-speed signal without deteriorating quality of the signal.

As was revealed by the inventors' research and described in FIGS. 1 and 2, the cause of the deterioration of the transmission characteristics (signal quality) is that there exists a large parasitic capacitance between the signal pad 104s and the semiconductor element interconnection 102 in the lower layer. Therefore, according to the present invention, the super-connect technology (the super-connect insulating layer 9, the super-connect via 8 and the super-connect interconnection 10) and the area reduction of the signal pad 4s are combined as shown in FIG. 3. It is thus possible to greatly reduce the parasitic capacitance component in the high-speed signal transmission particularly over 10 Gbps, to suppress the deterioration of the signal quality, and to achieve signal communication with a sufficient margin.

Figure 4A:
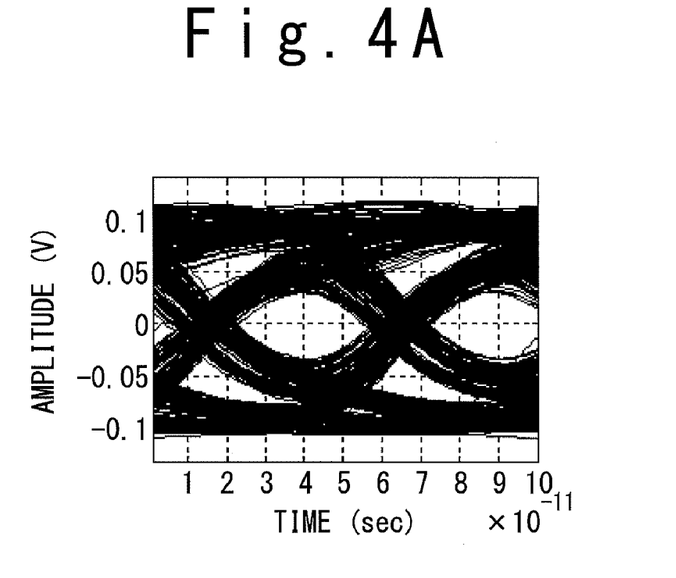
FIG. 4A is a graph showing signal characteristics in the semiconductor device according to the related technique.
Figure 4B:
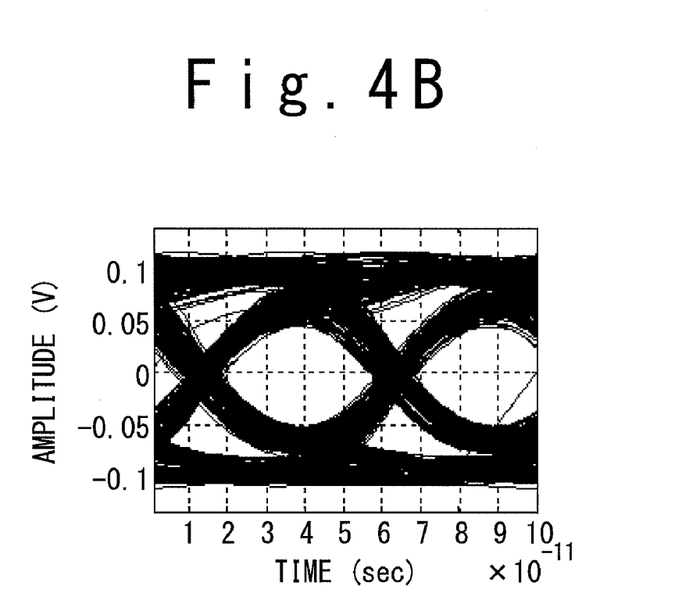
FIG. 4B is a graph showing signal characteristics in each semiconductor device according to the present invention.
Figure 5:
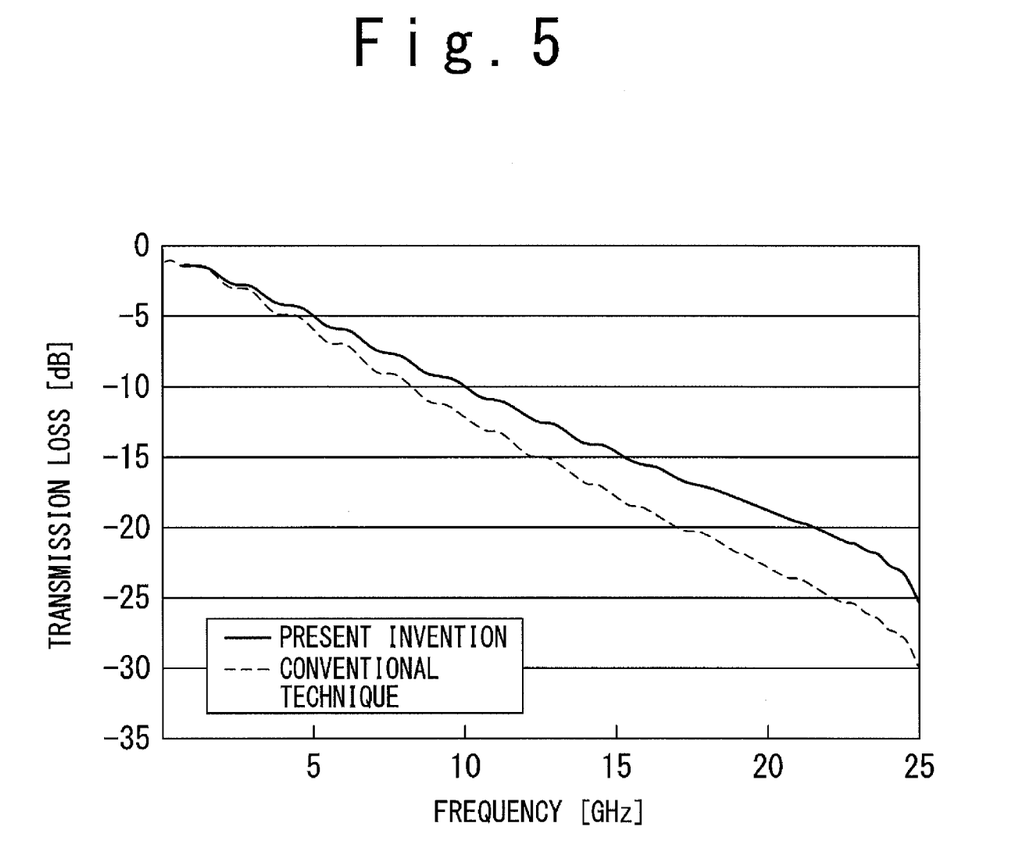
FIG. 5 is a graph in which transmission loss of a signal in each of the semiconductor device of the related technique and the semiconductor device of the present invention is plotted against frequency.

FIG. 4 is a graph showing signal characteristics in each of the semiconductor device according to the related technique and the semiconductor device according to the present invention. FIG. 4A shows the case of the semiconductor device according to the related technique, and FIG. 4B shows the case of the semiconductor device according to the present invention. The vertical axis represents amplitude (V), and the horizontal axis represents a time (sec.). In these graphs, the eye pattern with respect to 10 Gbps is shown as the signal characteristics. In the case of the related technique (FIG. 4A), the eye scarcely opens and the signal quality is deteriorated. While on the other hand, in the case of the present invention (FIG. 4B), opening of the eye is observed and it can be seen that there is no deterioration of the signal quality and the ultrahigh-speed transmission is possible. Similarly, FIG. 5 is a graph in which transmission loss of a signal in each of the semiconductor device of the related technique and the semiconductor device of the present invention is plotted against frequency. The vertical axis represents the transmission loss, and the horizontal axis represents the frequency. In the case of the related technique (dashed line), the transmission loss is greatly increased as the frequency is increased, and thus the high-speed transmission is difficult. While on the other hand, in the case of the present invention (solid line), it can be seen that the deterioration rate of the transmission loss against the frequency is smaller and thus the signal transmission is possible up to the higher frequency.

Next, the method of manufacturing the semiconductor device according to the first exemplary embodiment of the present invention will be described below. FIGS. 6A to 6C and 7A to 7B are cross-sectional views showing processes of manufacturing the semiconductor device according to the first exemplary embodiment of the present invention.

Figure 6A:
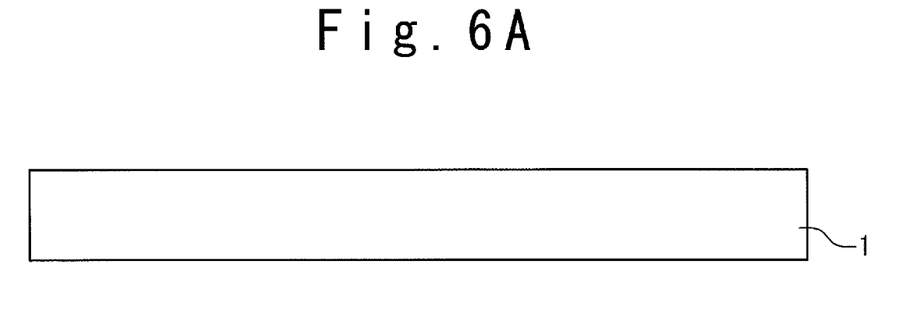
FIG. 6A is a cross-sectional view showing a process of manufacturing the semiconductor device according to the first exemplary embodiment of the present invention.
Figure 6B:
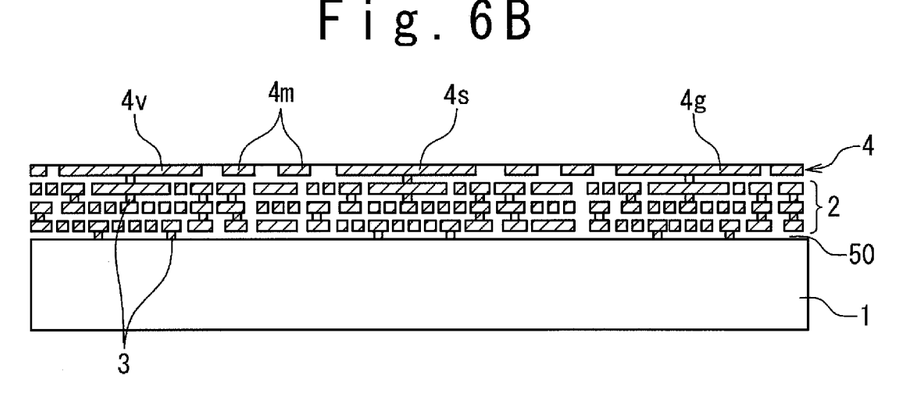
FIG. 6B is a cross-sectional view showing a process of manufacturing the semiconductor device according to the first exemplary embodiment of the present invention.
Figure 6C:
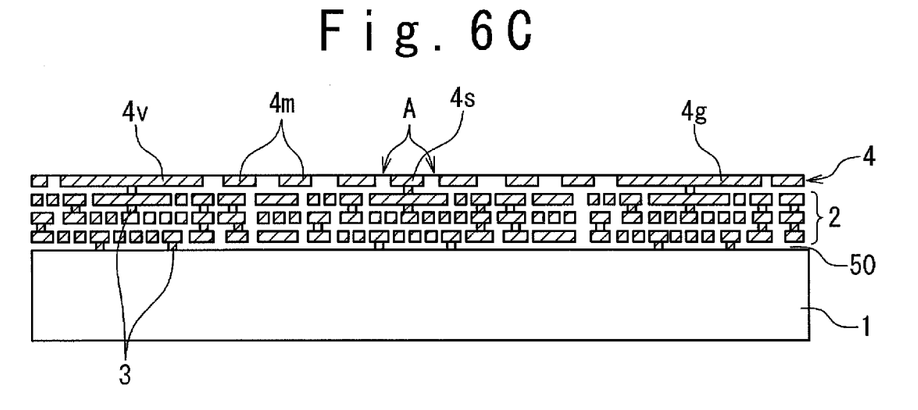
FIG. 6C is a cross-sectional view showing a process of manufacturing the semiconductor device according to the first exemplary embodiment of the present invention.

First, as shown in FIG. 6A, transistor circuits (not shown) are formed on the semiconductor substrate 101 such as silicon. Subsequently, as shown in FIG. 6B, the semiconductor element interconnections 2 are so formed as to be provided in the plurality of insulating layers 50 and connected through the semiconductor element interconnection via 3, by using such processes as lithography, plating and the like. Next, the top-layer semiconductor element interconnection 4 is formed by using a substantially equivalent process equipment as in the case of the semiconductor element interconnection 2. At this time, there is no need to change design of the semiconductor element of the related technique, and the signal pad 4s, the power source pad 4v and the ground pad 4g in the top-layer semiconductor element interconnection 4 may be the same in size. Next, as shown in FIG. 6C, slits (A section) are formed by using laser and the like at a part of a metal interconnection to be the signal pad 4s, such that the center section of the signal pad 4s is isolated and its area is made smaller.

Figure 7A:
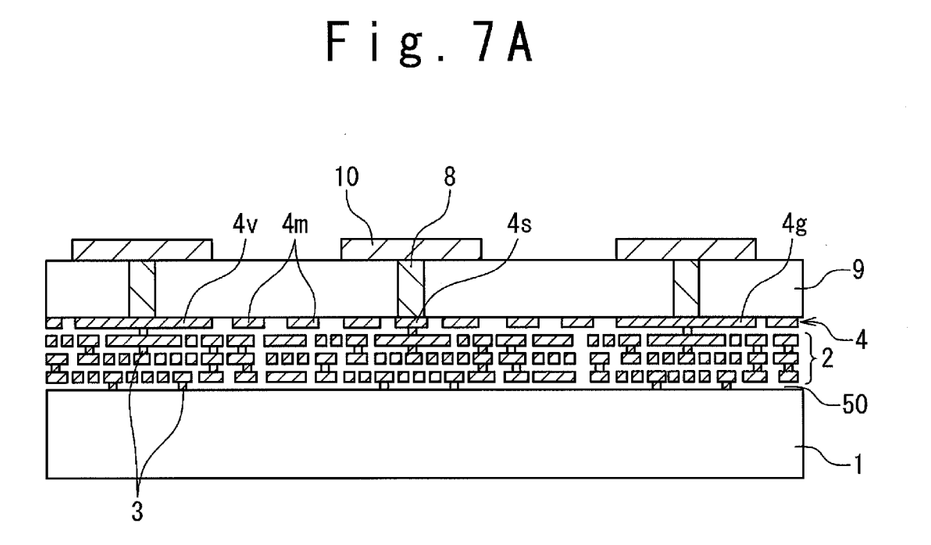
FIG. 7A is a cross-sectional view showing a process of manufacturing the semiconductor device according to the first exemplary embodiment of the present invention.
Figure 7B:
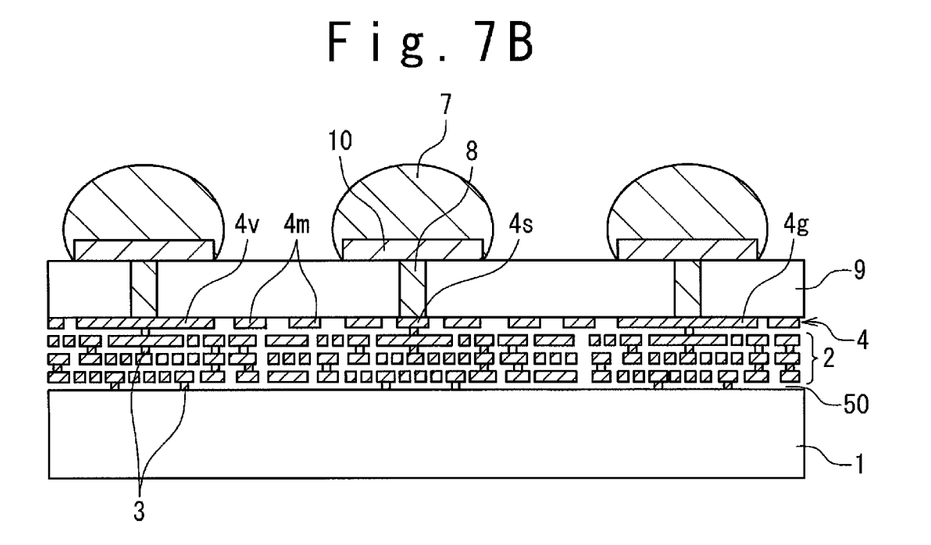
FIG. 7B is a cross-sectional view showing a process of manufacturing the semiconductor device according to the first exemplary embodiment of the present invention.

Next, as shown in FIG. 7A, the super-connect vias 8 are respectively formed on the signal pad 4s (center section), the power source pad 4v and the ground pad 4g. The super-connect insulating film 9 is so formed as to cover the super-connect vias 8 and the insulating layer 50 in which the top-layer semiconductor element interconnection 4 is embedded, by spin coat, press or laminate. Then, a surface of the super-connect insulating film 9 is planarized by using a polishing method such as CMP. A surface of the top portion of the super-connect via 8 is exposed. Furthermore, the super-connect interconnection 10 having a predetermined shape and connected to the super-connect via 8 is formed thereon. Finally, as shown in FIG. 7B, the bump 7 as the external connection terminal is formed on the super-connect interconnection 10 and the semiconductor device is completed.

According to the present exemplary embodiment, it is possible to manufacture the semiconductor device that can reduce the parasitic capacitance component of the signal line and suppress the deterioration of the signal quality, without changing an expensive design mask for the semiconductor element.

Second Exemplary Embodiment

Figure 8:
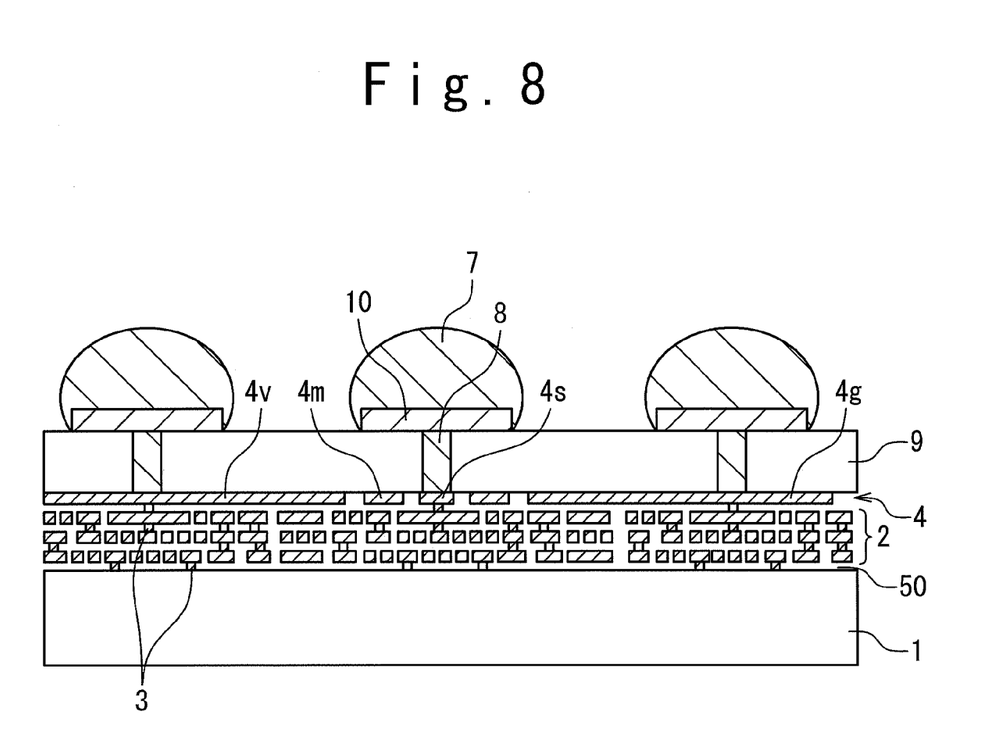
FIG. 8 is a cross-sectional view showing a configuration of a semiconductor device according to a second exemplary embodiment of the present invention.

The semiconductor device and the method of manufacturing the semiconductor device according to a second exemplary embodiment of the present invention will be described below with reference to the attached drawings. FIG. 8 is a cross-sectional view showing a configuration of the semiconductor device according to the second exemplary embodiment of the present invention. The semiconductor device has the semiconductor substrate 1, the semiconductor element interconnection 2, the semiconductor element interconnection via 3, the top-layer semiconductor element interconnection 4, the super-connect insulating layer 9, the super-connect via 8, the super-connect interconnection 10 and the bump 7. These basic components are the same as in the first exemplary embodiment. However, the following points are different from the first exemplary embodiment.

That is, according to the present exemplary embodiment as shown in FIG. 8, regarding the pads of the top-layer semiconductor element interconnection 4 connected to the super-connect via 8, the area of the signal pad 4s is smaller as compared with each area of the other power source pad 4v and ground pad 4g, and further the power source pad 4v and the ground pad 4g each extends to a region wider than a projection image of the bump 7 connected thereto. In other words, when the bump 7 is projected onto the interconnection layer of the top-layer semiconductor element interconnection 4, at least a part of the power source pad 4v and the ground pad 4g extends outward from the projection image region. These are the features of the present exemplary embodiment.

Here, it is preferable that the area of the signal pad 4s is as small as possible to the extent permitted by the formation margin of the super-connect via 8. On the other hand, the areas of the power source pad 4v and the ground pad 4g are preferably as large as possible to the extent permitted by areas allocated to the signal pad 4s and the routed interconnection 4m and interconnection margin.

Due to the above-described structure, the parasitic capacitance regarding the power source and ground becomes larger as compared with the first exemplary embodiment of the present invention. The increased capacitance functions as a decoupling capacitor, which reduces switching noise and stabilizes the operation of the semiconductor device further.

The method of manufacturing the semiconductor device according to the second exemplary embodiment of the present invention is the same as in the first exemplary embodiment except that the areas of the power source pad 4v and the ground pad 4g are relatively large, whose description is omitted here. The effects as in the first exemplary embodiment can be obtained.

Third Exemplary Embodiment

Figure 9:
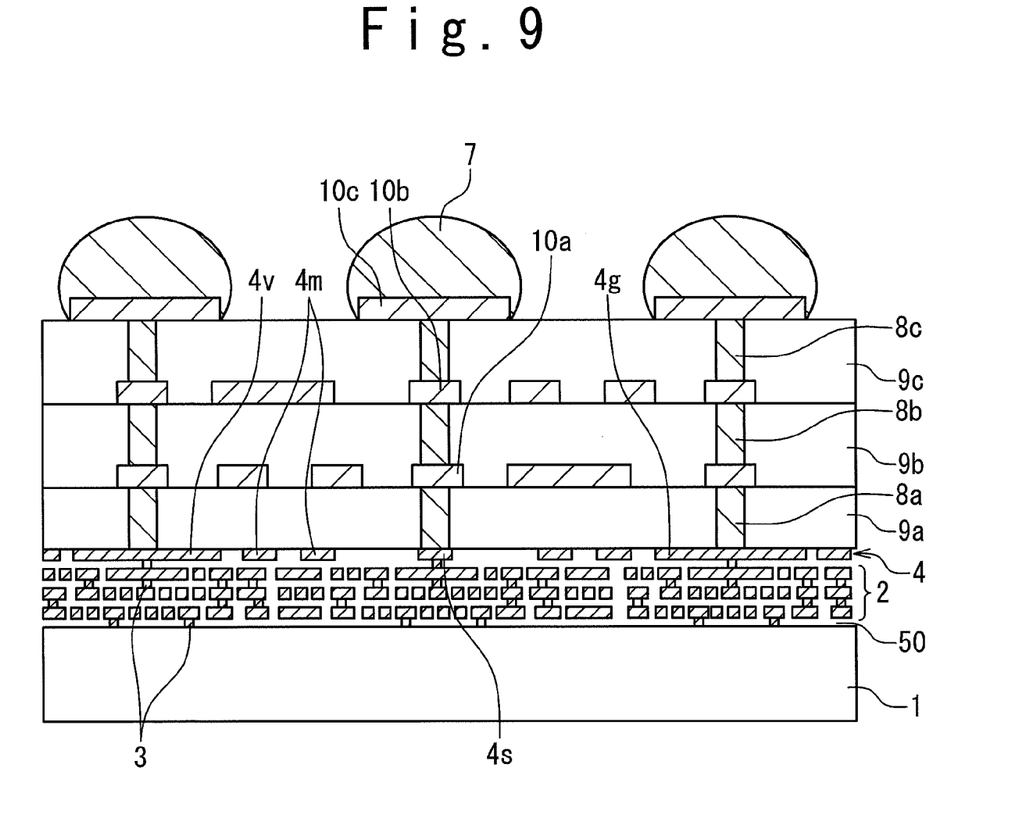
FIG. 9 is a cross-sectional view showing a configuration of a semiconductor device according to a third exemplary embodiment of the present invention.

The semiconductor device and the method of manufacturing the semiconductor device according to a third exemplary embodiment of the present invention will be described below with reference to the attached drawings. FIG. 9 is a cross-sectional view showing a configuration of the semiconductor device according to the third exemplary embodiment of the present invention. The semiconductor device has the semiconductor substrate 1, the semiconductor element interconnection 2, the semiconductor element interconnection via 3, the top-layer semiconductor element interconnection 4, the super-connect insulating layer 9, the super-connect via 8, the super-connect interconnection 10 and the bump 7. Here, the semiconductor substrate 1, the semiconductor element interconnection 2, the semiconductor element interconnection via 3 and the top-layer semiconductor element interconnection 4 are the same as in the first exemplary embodiment.

The super-connect insulating layer 9 is so provided as to cover the top-layer semiconductor element interconnection 4. The super-connect insulating layer 9 includes super-connect insulating layers 9a, 9b and 9c that are stacked in this order. The super-connect via 8 is so provided as to be connected to the top portion of the top-layer semiconductor element interconnection 4 and penetrate through the super-connect insulating layer 9. The super-connect via 8 includes a super-connect via 8a penetrating through the super-connect insulating layer 9a, a super-connect via 8b penetrating through the super-connect insulating layer 9b, and a super-connect via 8c penetrating through the super-connect insulating layer 9c. The super-connect interconnection 10 is provided on the super-connect insulating layer 9 and connected to the top portion of the super-connect via 8. The super-connect interconnection 10 includes a super-connect interconnection 10a provided on the super-connect insulating layer 9a and connected to the top portion of the super-connect via 8a, a super-connect interconnection 10b provided on the super-connect insulating layer 9b and connected to the top portion of the super-connect via 8b, and a super-connect interconnection 10c provided on the super-connect insulating layer 9c and connected to the top portion of the super-connect via 8c. The bump 7 is formed as an external connection terminal on the super-connect interconnection 10c.

Here, the super-connect insulating layers 9a, 9b and 9c, the super-connect vias 8a, 8b and 8c and the super-connect interconnections 10a, 10b and 10c are formed by using a process equipment that is substantially different from that for the semiconductor element interconnection 2 and the top-layer semiconductor element interconnection 4. A thickness of each the super-connect interconnections 10a, 10b and 10c is three or more times larger than a thickness of each the semiconductor element interconnection 2 and the top-layer semiconductor element interconnection 4. A thickness of each the super-connect insulating layers 9a, 9b and 9c is five or more times larger than a thickness of the insulating layer provided between the semiconductor element interconnections 2 or the top-layer semiconductor element interconnection 4.

That is, according to the present exemplary embodiment as shown in FIG. 9, regarding the pads of the top-layer semiconductor element interconnection 4 connected to the super-connect via 8, the area of the signal pad 4s is smaller as compared with each area of the other power source pad 4v and ground pad 4g. Furthermore, the super-connect via 8, the super-connect insulating film 9 and the super-connect interconnection 10 each has a multilayer structure (three layers in the present exemplary embodiment). These are the features of the present exemplary embodiment.

Here, it is preferable that the area of the signal pad 4s is as small as possible to the extent permitted by the formation margin of the super-connect via 8a. On the other hand, the number of super-connect layers is preferably as many as possible to the extent permitted by material and process. However, the thickness of a single super-connect insulating layer 9 is five or more times larger than the thickness of a single insulating layer 50 provided between the semiconductor element interconnections 2. Therefore, warpage of wafer due to stress at the time of film formation may affect transistor characteristics or may exceed acceptable warpage amount that can be introduced into the process equipment. Therefore, the most preferable number of layers is in a rage from two to six.

Due to the above-described structure, the parasitic capacitance on the signal line can be reduced further as compared with the first and second exemplary embodiments of the present invention. As a result, it is possible to transmit further high-speed signal.

The method of manufacturing the semiconductor device according to the third exemplary embodiment of the present invention is the same as in the first exemplary embodiment except that the super-connect via 8, the super-connect insulating film 9 and the super-connect interconnection 10 each has the multilayer structure (three layers in the present exemplary embodiment), whose description is omitted here. The effects as in the first exemplary embodiment can be obtained.

Fourth Exemplary Embodiment

Figure 10:
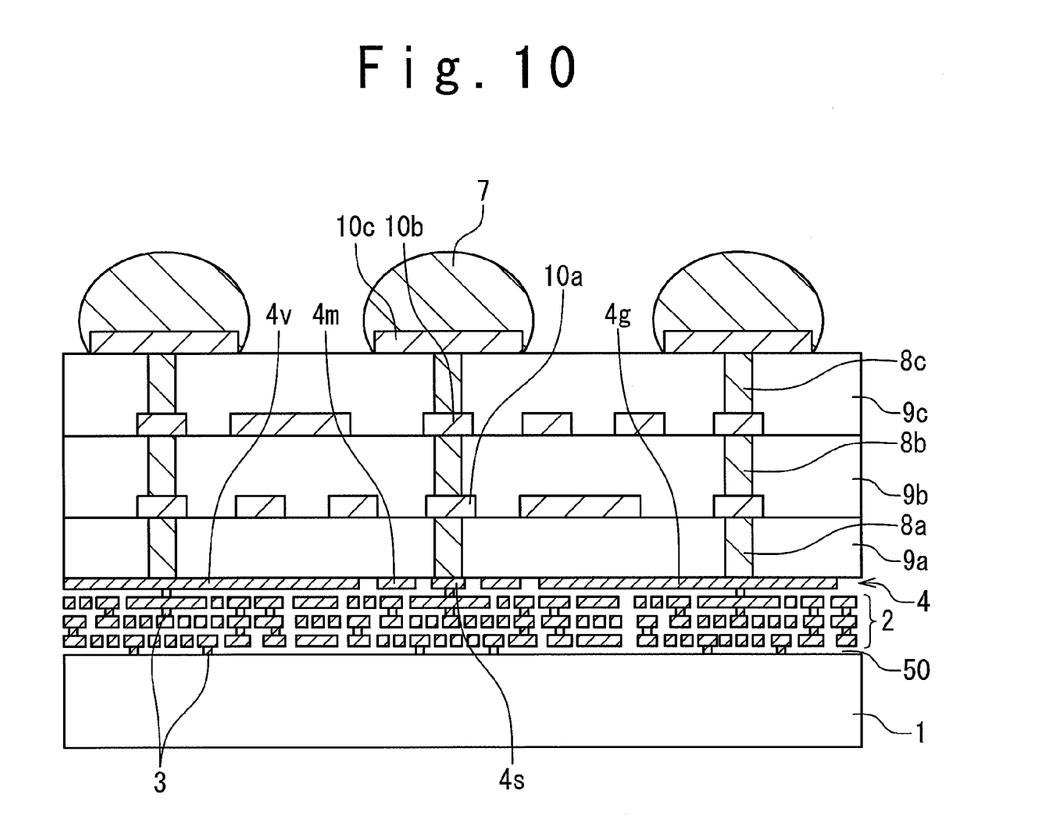
FIG. 10 is a cross-sectional view showing a configuration of a semiconductor device according to a fourth exemplary embodiment of the present invention.

The semiconductor device and the method of manufacturing the semiconductor device according to a fourth exemplary embodiment of the present invention will be described below with reference to the attached drawings. FIG. 10 is a cross-sectional view showing a configuration of the semiconductor device according to the fourth exemplary embodiment of the present invention. The semiconductor device has the semiconductor substrate 1, the semiconductor element interconnection 2, the semiconductor element interconnection via 3, the top-layer semiconductor element interconnection 4, the super-connect insulating layer 9, the super-connect via 8, the super-connect interconnection 10 and the bump 7.

The semiconductor device according to the present exemplary embodiment is configured to be a combination of the second exemplary embodiment and the third exemplary embodiment. That is to say, it has the configuration feature of the second exemplary embodiment that the area of the signal pad 4s is smaller as compared with each area of the other power source pad 4v and ground pad 4g, and further the power source pad 4v and the ground pad 4g each extends to a region wider than the projection image of the bump 7 connected thereto. Moreover, it has the configuration feature of the third exemplary embodiment that the super-connect via 8, the super-connect insulating film 9 and the super-connect interconnection 10 each has the multilayer structure (three layers in the present exemplary embodiment). The details of each configuration are the same as in the second exemplary embodiment and the third exemplary embodiment, whose description is omitted here.

Due to the above-described structure, the parasitic capacitance regarding the power source and ground becomes larger as compared with the third exemplary embodiment of the present invention. The increased capacitance functions as a decoupling capacitor, which reduces switching noise and stabilizes the operation of the semiconductor device further.

The method of manufacturing the semiconductor device according to the fourth exemplary embodiment of the present invention is the same as in the first exemplary embodiment except that the areas of the power source pad 4v and the ground pad 4g are relatively large and the super-connect via 8, the super-connect insulating film 9 and the super-connect interconnection 10 each has the multilayer structure (three layers in the present exemplary embodiment), whose description is omitted here. The effects as in the first exemplary embodiment can be obtained.

Fifth Exemplary Embodiment

Figure 11:
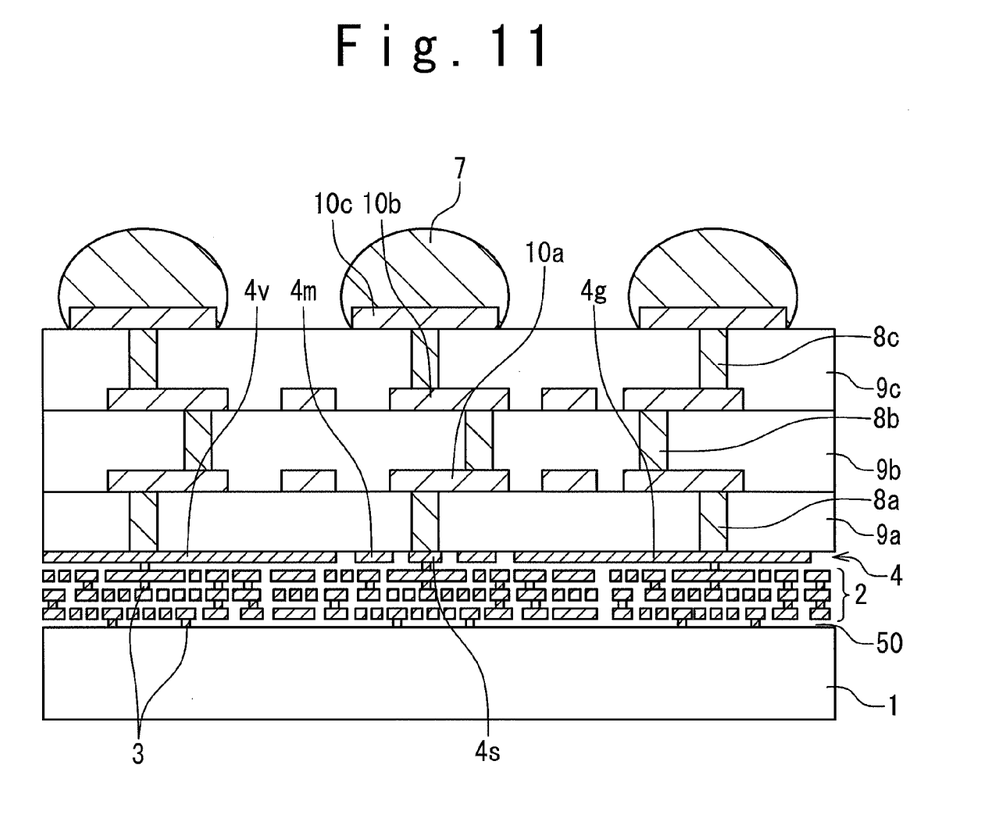
FIG. 11 is a cross-sectional view showing a configuration of a semiconductor device according to a fifth exemplary embodiment of the present invention.

The semiconductor device and the method of manufacturing the semiconductor device according to a fifth exemplary embodiment of the present invention will be described below with reference to the attached drawings. FIG. 11 is a cross-sectional view showing a configuration of the semiconductor device according to the fifth exemplary embodiment of the present invention. The semiconductor device has the semiconductor substrate 1, the semiconductor element interconnection 2, the semiconductor element interconnection via 3, the top-layer semiconductor element interconnection 4, the super-connect insulating layer 9, the super-connect via 8, the super-connect interconnection 10 and the bump 7.

The present exemplary embodiment is a modified example of the fourth exemplary embodiment shown in FIG. 10. As shown in FIG. 11, the super-connect vias 8a, 8b and 8c are not aligned but arranged in a step pattern as compared with the fourth exemplary embodiment shown in FIG. 10, which is the feature of the present exemplary embodiment. The other details of the semiconductor device are the same as in the fourth exemplary embodiment, whose description is omitted here.

In the above-described structure, the super-connect vias 8a, 8b and 8c are not aligned as compared with the fourth exemplary embodiment of the present invention. Therefore, even if stress is applied to a semiconductor transistor layer through the bump 7 as the external terminal during the operation of the semiconductor device, the stress is relaxed within the three-layer structure of the super-connect and its influence on the transistor is reduced. As a result, reliability of the semiconductor device is improved.

The method of manufacturing the semiconductor device according to the fifth exemplary embodiment of the present invention is the same as in the first exemplary embodiment except that the super-connect vias 8a, 8b and 8c are not aligned, whose description is omitted here. The effects as in the fourth exemplary embodiment can be obtained.

In each exemplary embodiment described above, one pad and one bump are illustrated for each signal, power source and ground. However, the effects of the present invention are not limited to the case of one pad and one bump but similarly apply to a case of a plurality pads and bumps. The effects are particularly powerful when applied to the signal pad 4s associated with the highest-speed signal path in the semiconductor device as a whole.

In each exemplary embodiment described above, the super-connect insulating film 9 exists on the side of the super-connect via 8, and the super-connect interconnection 10 exists on the super-connect via 8 and the super-connect insulating film 9. This structure is obtained by forming the super-connect via 8 in a post form by metal such as copper, then forming the super-connect insulating film 9 with organic resin such as polyimide, and then planarizing by a polishing technique to expose an upper surface of the post. However, the present invention is not limited to this structure. For example, if the super-connect insulating film 9 is photosensitive resin, vias are first formed in the super-connect insulating film 9 by an exposure technology and then the super-connect via 8 and the super-connect interconnection 10 are integrally formed. Also, even if the super-connect insulating film 9 is non-photosensitive resin, a similar structure can be achieved by forming the vias by using laser.

In each exemplary embodiment described above, a passive element such as capacitor, inductor, resistor and the like that plays a role of a noise filter of the circuit may be provided at a desired position in the super-connect interconnection layer.

In the exemplary embodiment of the present invention, the signal quality of the high-speed signal of 10 Gbps is described. However, the effects of the present invention are not limited to the signal of 10 Gbps or more. The effects can also be obtained for the lower-speed signal.

According to the semiconductor device of the present invention, as described above, the parasitic capacitance component between the signal pad and the semiconductor element interconnection can be reduced, while maintaining the shape and pitch of the bump substantially identical to those of the semiconductor device of the related technique. It is therefore possible to suppress the deterioration of the signal quality and to achieve signal communication with a sufficient margin, particularly in the high-speed signal transmission over 10 Gbps.

Moreover, the parasitic capacitance between the semiconductor element interconnection and the power source pad and the ground pad can be made large, and the capacitance functions as a decoupling capacitor. It is thus possible to reduce the switching noise and to stabilize the operation of the semiconductor device further.

Furthermore, even if stress is applied to a semiconductor transistor layer through the bump 7 as the external terminal, the stress is relaxed within the super-connect layer and its influence on the transistor can be reduced. As a result, reliability of the semiconductor device can be improved.

Moreover, according to the method of manufacturing the semiconductor device of the present invention, it is possible to add the super-connect interconnection to an already-designed semiconductor device that does not have the super-connect interconnection, while reducing the parasitic capacitance of the signal line. Therefore, it is possible to improve the quality of the high-speed signal particularly over 10 Gbps with low cost and without newly creating an expensive mask.

It is apparent that the present invention is not limited to the above exemplary embodiments and may be modified and changed without departing from the scope and spirit of the present invention.

According to the present invention, it is possible to input/output the high-speed signal without deteriorating the signal quality. When such a high-speed signal is handled in a large-scale integrated circuit, the switching noise with respect to the power/ground system is reduced and thereby a stable operation can be achieved. It is possible to reduce the parasitic capacitance between the signal pad and the semiconductor element interconnection in the lower layer and thus to improve the transmission characteristics.

The invention claimed is:

1. A semiconductor device comprising:
an element interconnection provided on a semiconductor substrate having a semiconductor element through a plurality of insulating layers;
a top-layer element interconnection formed above said element interconnection by using a substantially equivalent process equipment;
a super-connect interconnection provided on said top-layer element interconnection through a super-connect insulating layer; and
a bump formed on said super-connect interconnection, wherein said top-layer element interconnection comprises a signal pad, a power source pad and a ground pad, and
an area of said signal pad is smaller than each area of said power source pad and said ground pad.

2. The semiconductor device according to claim 1, wherein said super-connect insulating layer is thicker than said insulating layer.

3. The semiconductor device according to claim 2, wherein said super-connect insulating layer has a thickness five or more times larger than that of said insulating layer.

4. The semiconductor device according to claim 1,
wherein said super-connect interconnection is thicker than each said element interconnection and said top-layer element interconnection.

5. The semiconductor device according to claim 4,
wherein said super-connect interconnection has a thickness three or more times larger than that of each said element interconnection and said top-layer element interconnection.

6. The semiconductor device according to claim 1,
wherein said super-connect insulating layer is thicker than said insulating layer, and said super-connect interconnection is thicker than each said element interconnection and said top-layer element interconnection.

7. The semiconductor device according to claim 6,
wherein said super-connect insulating layer has a thickness five or more times larger than that of said insulating layer, and said super-connect interconnection has a thickness three or more times larger than that of each said element interconnection and said top-layer element interconnection.

8. The semiconductor device according to claim 1,
wherein at least one pad of said power source pad and said ground pad extends outward from a projection image that is obtained by projecting said bump connected to the one pad through said super-connect interconnection onto an interconnection layer of said top-layer element interconnection.

9. The semiconductor device according to claim 1,
wherein at least one of said super-connect insulating layer and said super-connect interconnection has a multilayer structure including two or more layers.

10. The semiconductor device according to claim 9, further comprising a super-connect via provided in each layer of said super-connect insulating layer having said multilayer structure,
wherein said super-connect via of said each layer does not align in a vertical direction.

* * * * *